United States Patent [19]
Brorby

[11] Patent Number: 5,576,936
[45] Date of Patent: Nov. 19, 1996

[54] COMPACT ELECTRONIC DATA MODULE WITH NONVOLATILE MEMORY

[75] Inventor: Michael J. Brorby, Redmond, Oreg.

[73] Assignee: MacSema, Inc., Bend, Oreg.

[21] Appl. No.: 575,649

[22] Filed: Dec. 20, 1995

Related U.S. Application Data

[63] Continuation of Ser. No. 76,236, Jun. 14, 1993, Pat. No. 5,506,757.

[51] Int. Cl.⁶ ........................................ H05K 7/14
[52] U.S. Cl. .................... 361/796; 361/752; 361/761; 174/17 R
[58] Field of Search ............................ 361/752, 761, 361/748, 807, 796; 174/17 R, 52.2, 52.3, 52.4, 50.4, 50; 439/61; 206/334, 328

[56] References Cited

U.S. PATENT DOCUMENTS

| | | |
|---|---|---|
| 3,996,735 | 12/1976 | Zurcher ........................... 58/50 R |
| 4,578,573 | 3/1986 | Flies et al. . |
| 4,752,911 | 6/1988 | Prevost et al. . |
| 4,860,228 | 8/1989 | Carroll . |
| 4,868,409 | 9/1989 | Tanaka et al. . |
| 4,965,828 | 10/1990 | Ergott, Jr. et al. . |
| 4,982,371 | 1/1991 | Bolan et al. . |
| 4,999,742 | 3/1991 | Stampfli . |
| 5,001,670 | 3/1991 | Slate et al. . |
| 5,058,074 | 10/1991 | Sakamoto . |
| 5,070,500 | 12/1991 | Horinouchi et al. . |
| 5,091,771 | 2/1992 | Bolan et al. . |
| 5,163,025 | 11/1992 | Chamberlain . |
| 5,173,876 | 12/1992 | Kawashima et al. . |
| 5,191,554 | 3/1993 | Lee . |
| 5,196,374 | 3/1993 | Hundt et al. . |
| 5,197,026 | 3/1993 | Butler . |
| 5,206,938 | 4/1993 | Fujioka . |

*Primary Examiner*—Leo P. Picard
*Assistant Examiner*—Y. Whang
*Attorney, Agent, or Firm*—Kolisch, Hartwell, Dickinson, McCormack & Heuser

[57] ABSTRACT

A compact electronic data module is provided which includes non-volatile memory, device. The memory device is mounted on a printed circuit board, which in turn is housed in a unitary tubular casing. The memory device is in the form of an integrated circuit (in a low-height package, such as a flat-pack or SOIC) which is mounted on the printed circuit board. One side of the printed circuit board is exposed to provide exterior contacts and the other side is placed inside the casing and covered with potting material. Simple wiring on the small board, using a through-hole vias, suffices to route power, ground, and data lines to the integrated circuit, while providing a sealed durable package with three external contacts.

13 Claims, 4 Drawing Sheets

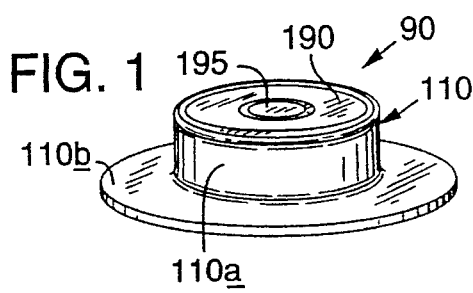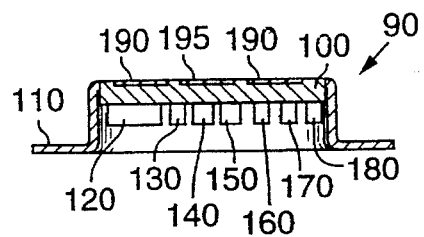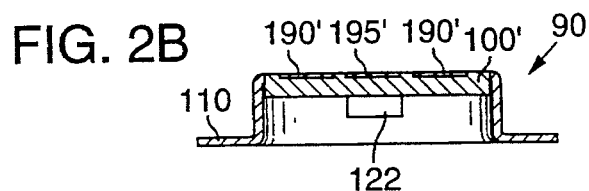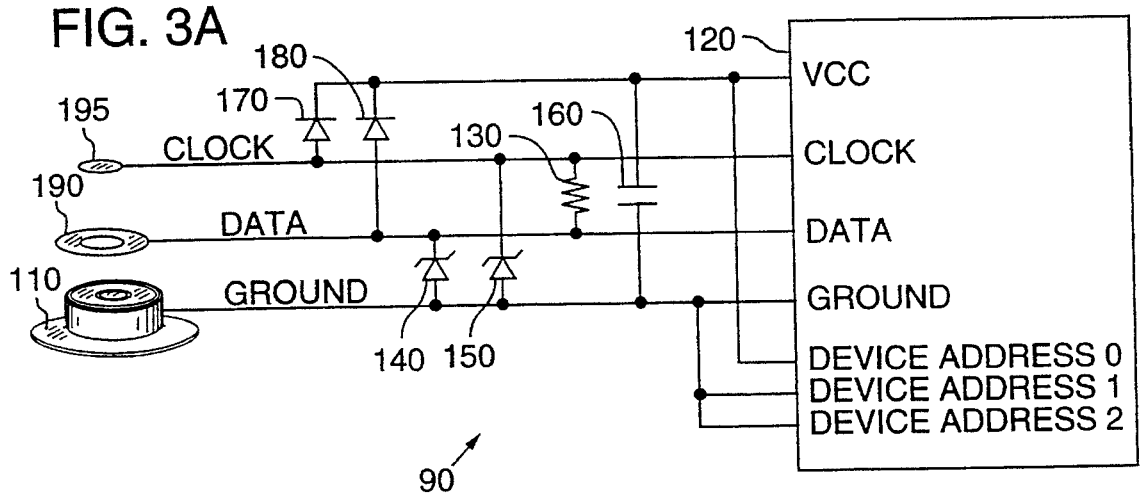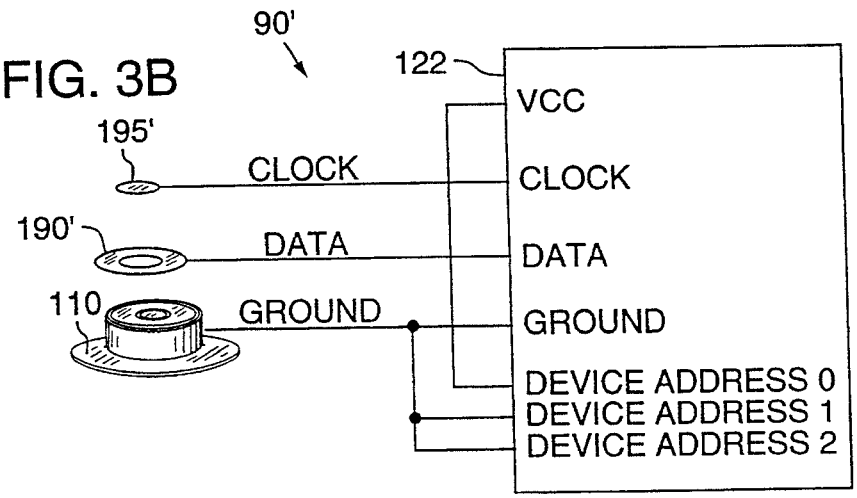

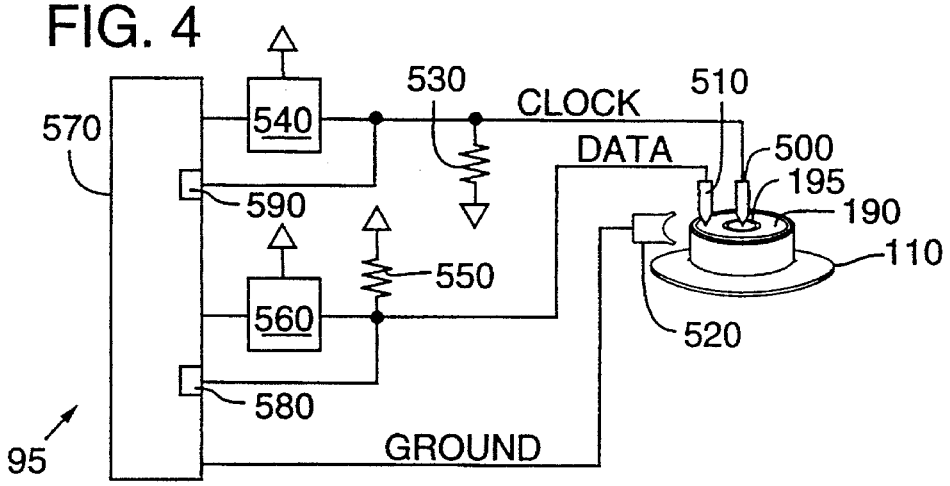
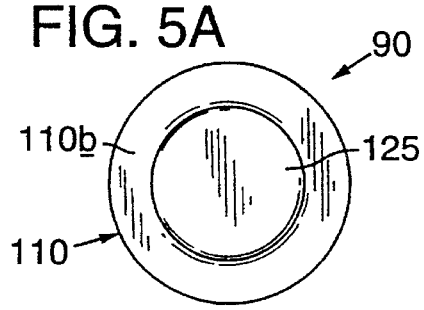
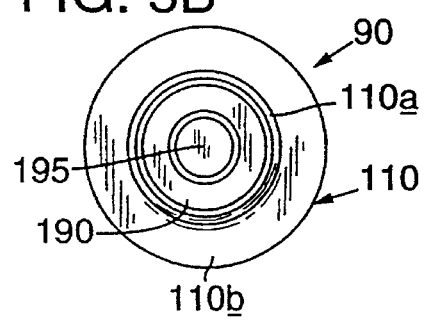
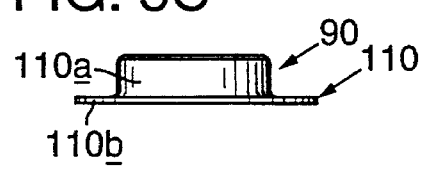
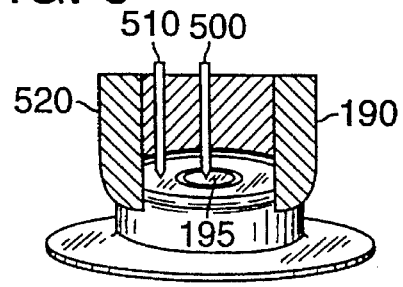
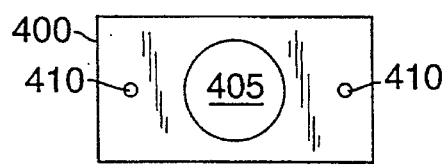
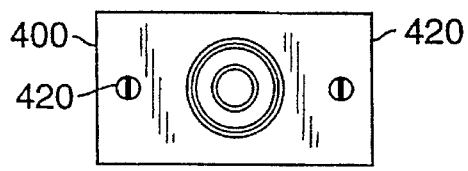

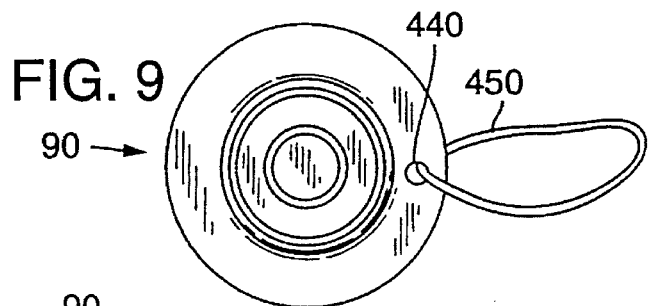
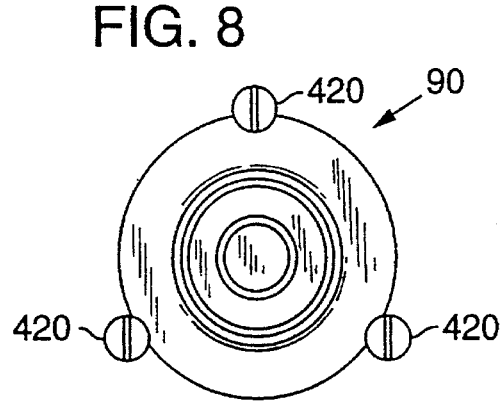
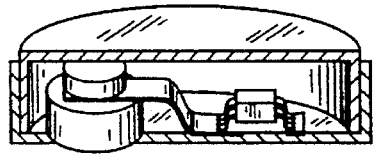
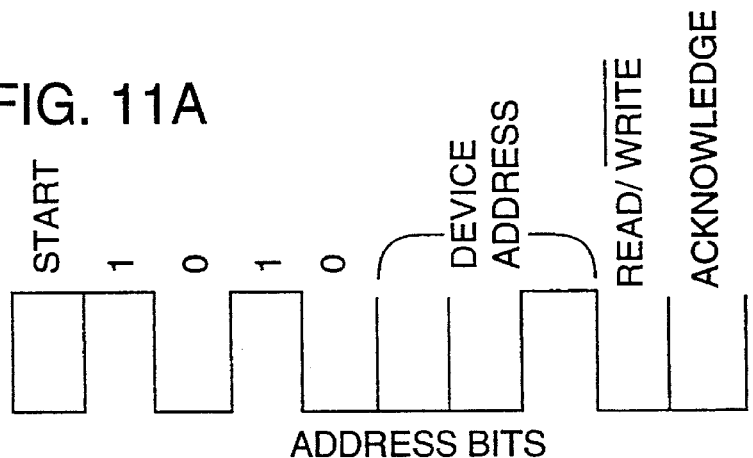
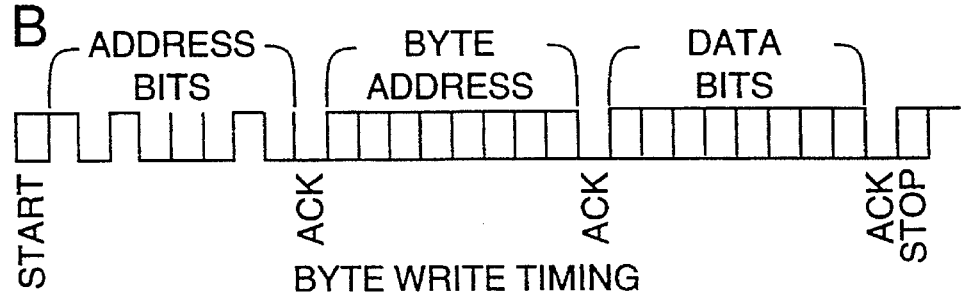
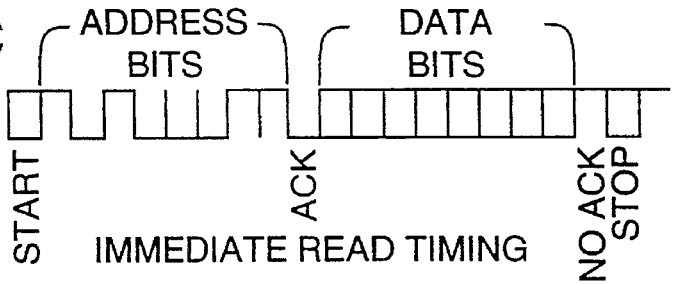

START

STOP

WRITE ZERO

WRITE ONE

READ

COMPACT ELECTRONIC DATA MODULE WITH NONVOLATILE MEMORY

CROSS REFERENCE TO RELATED APPLICATIONS

This application is a continuation of Ser. No. 08/076,236, filed Jun. 14, 1993 now U.S. Pat. No. 5,506,757.

TECHNICAL FIELD

The present invention relates generally to electronic data modules, and more particularly, to a compact electronic data module which employs a nonvolatile memory device.

BACKGROUND ART

One of the long-term goals in electronics technology has been to provide higher functionality at a lower cost, and in a more compact package. Electronic data modules are no different. There is a constant struggle to increase memory capacity and access speed, while at the same time decreasing module cost and size. The numerous innovations disclosed herein are believed to contribute to a major advance in this direction.

As a result of the aforementioned trend toward compactness, data modules have been constructed using integrated circuit technology, and using very small casings which provide contacts whereby such data modules may be accessed. Current modules, however, have not met commercial expectations, particularly in the areas of reliability and module life. Data often is lost or miscommunicated due to dead batteries, or to poor electrical connections within the module itself. The data module disclosed in U.S. Pat. No. 4,982,371 to Bolan et al., for example, has many limiting features, including limitations related to the use of onboard battery power, and to the abundance of electrical connections between module components. The Bolan module is shown in Fig. 10 of the drawings.

The Bolan module, it will be noted, contains six distinct components, all of which must be electrically connected to make the module work. These components are: 1) a first casing half, 2) a second casing half, 3) a battery, 4) an integrated circuit, 5) a flexible circuit board, and 6) an elastic conductive material. The Bolan module thus has many connections, each connection making the module less reliable, or more likely to fail. The connections are: 1) the first casing half to the elastic conductive material, 2) the elastic conductive material to the printed circuit board, 3) the printed circuit to the integrated circuit, 4) the printed circuit board to the positive battery terminal, and 5) the negative battery terminal to the second casing half.

The Bolan module also employs an onboard battery, the module life thus extending only as long as the battery life. Once the battery voltage deteriorates to a point that the memory loses data, the module is no longer useful. Because all batteries self discharge, it will be understood that failure of the module and a loss of the data contained therein will eventually result. Additionally, the rate of battery discharge may be accelerated by various factors, including the number of transactions that the module performs, the temperature, and the RAM memory size. Further, because batteries generally include hazardous materials such as lithium and mercury, the Bolan data module may be environmentally unsafe.

The casing of the Bolan module also is unsuitable, it being difficult to mount or attach the module to physical items. The Bolan module's casing, it will be noted, is divided into first and second casing halves. This two-part casing makes it difficult to "pot" internal components, a procedure often used to ensure that all electrical connections are secure. The Bolan module instead relies on an elastic conductive material which applies pressure to contact points on the first and second casing halves. Potting material must be kept clear of these contact points. This is accomplished by pouring potting material into one-half of the casing, and then fitting the other half of the casing over the first casing half. If too much potting material is poured into the first casing half, an open contact can result. If too little potting material is poured into the first casing half, the casing can be partially crushed during use. Also, potting material can surround the elastic conductive material, thus reducing the amount of pressure the elastic conductive material exerts on the contact points.

The Bolan module also has a relatively slow transfer rate of data into and out of the module due to the crude time base of an unstabilized oscillator. Although the crude time base of an unstabilized oscillator can be laser trimmed for higher transfer rates, this process adds cost.

SUMMARY OF THE INVENTION

The present invention concerns a compact electronic data module which employs a nonvolatile memory device. The module is packaged in a unitary tubular casing, such casing preferably containing an integrated circuit which includes the module's memory device. The memory device is mounted on a printed circuit board, which in turn is potted in the casing so as to cover the memory device, but expose concentric contact areas which connect to the integrated circuit's signal (data and clock) lines. The casing serves as a third contact area which connects to the integrated circuit's Ground. The three contact areas are isolated from one another, each serving as a contact for connection to a host system which communicates data to and from the module. The module receives power through its signal lines using an innovative Powered I squared C (PIIC) bus protocol.

These and additional objects and advantages of the present invention will be more readily understood after a consideration of the drawings and the detailed description which follows.

BRIEF DESCRIPTION OF THE DRAWINGS

FIG. 1 is an isometric view of an electronic data module constructed in accordance with a preferred embodiment of the invention.

FIG. 2A is a side sectional view of the electronic data module shown in FIG. 1.

FIG. 2B is a side sectional view of an electronic data module similar to that shown in FIG. 1, but employing a highly integrated circuit.

FIG. 3A is a schematic diagram of the electronic data module depicted in FIG. 2A.

FIG. 3B is a schematic diagram of the electronic data module depicted in FIG. 2B.

FIG. 4 is a schematic diagram illustrating a host system for use in reading and writing to the data module of FIG. 1.

FIG. 5A is a bottom view of the data module of FIG. 1.

FIG. 5B is a top plan view of the data module of FIG. 1.

FIG. 5C is a side elevational view of the data module of FIG. 1.

FIG. 6 is a side sectional view illustrating connection of a host system's read head to the data module of FIG. 1.

FIG. 7A is a top plan view of a mounting plate for use in securing the preferred data module in place.

FIG. 7B is a top plan view of the mounting plate of FIG. 7A, but with the data module in place.

FIG. 8 is a top plan view of a first alternative data module mounting arrangement.

FIG. 9 is a top plan view of a second alternative mounting arrangement.

FIG. 10 is a partially sectioned isometric view of a prior art data module.

FIG. 11A illustrates the organization of bits sent by the host system to access the data module of FIG. 1.

FIG. 11B illustrates the organization of a write command.

FIG. 11C illustrates the organization of an immediate read command.

DETAILED DESCRIPTION AND BEST MODE FOR CARRYING OUT THE INVENTION

Figure 11D:
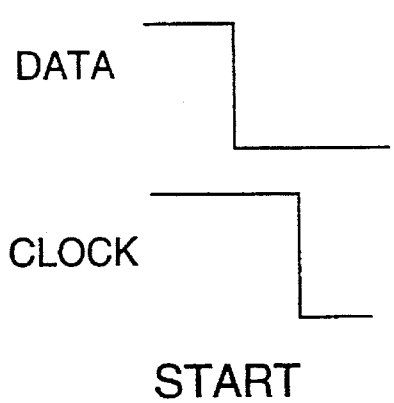
FIG. 11D is a timing diagram illustrating a start command.

Referring initially to FIG. 1, the reader will note that a compact electronic data module is shown at 90, such module being constructed in accordance with a preferred embodiment of the present invention. As indicated, module 90 employs a single-piece tubular metal casing 110 which defines a channel between opposite casing ends. The module's casing is in the form of an eyelet, including a barrel 110a with a lower perimeter flange 110b. Flange 110b is useful in mounting the module as will be described in detail below. The eyelet 110 is a Stimpson A1721. The diameter of the flange of the eyelet is 0.97". The barrel diameter of the eyelet is 0.64". The height of the eyelet is 0.20".

As indicated in FIG. 2A, an integrated circuit 120 (preferably in a low-height package, such as a flat-pack or SOIC) is mounted on a rigid, generally planar printed circuit board 100 which is formed to fit closely within casing 110. The printed circuit board preferably is offset from the flanged end of the casing, exposing an etched surface with a pair of conductive concentric circles 190, 195 (see also FIG. 5B) formed thereon. The conductive circles are electrically isolated from each other, and from the metal casing so as to provide first and second electrical contacts. Simple wiring on the circuit board, using through-hole vias, through the circuit board electronically connects the conductive circles to components mounted on the printed circuit board (e.g. integrated circuit 120). A third contact is provided by the metal casing itself, a solder pad being provided on the component side of the printed circuit board to electrically connect the printed circuit board to the metal casing. Potting material 125 (see FIG. 5A) is poured into the casing to cover the components on the printed circuit board (but not the contacts), and to hold the circuit board in place.

The electronic data modules can be used in several ways. For example, in some embodiments it may be preferable to use loose modules as tokens. However, in many applications (such as inventory control, machinery maintenance records, or retail tagging) it may be preferable to mount the data modules on the physical items to which the data in the individual modules refers. In such a situation, the module must be mounted so that all three of its contacts can be reached by the user. This generally means that the module's flanged end is adhered to a surface on the item to which the module refers. For such applications, modules may be shipped with double-sided adhesive tape already affixed to the flanged end of the module so that it may readily be secured to a surface.

Preferably, the double-sided tape has a high-tack face adhered to the casing flange 110b and potting material 125. The other side of the tape may be high-tack, for permanent mounting, or may be low-tack, for applications (such as retail) where the modules may be frequently reused. Often, the modules can be advantageously shipped with the low-tack faces of many modules stuck to a common cover sheet.

In many applications double-sided tape will not be strong enough to withstand forces to remove it from the surface which it is adhered to. The module thus may be fastened (as in FIG. 8) to a surface with fasteners such as screws 420. The fasteners cover a small portion of the casing's flange area 110b. A three point attachment pattern generally will not allow the module to move or shift.

A mounting plate 400 (as in FIG. 7A) alternatively may be placed over the casing's flange as indicated in FIG. 7B. Mounting plate 400, it will be noted, has three holes (a large hole 405 and two small holes 410). In use, the casing's barrel 110a is passed through large hole 405 so as to seat the module in the plate's large hole. The module can not pass completely through the large hole because the flange is larger than the large hole. The mounting plate 400 then is pressed against the physical item and fasteners 420 are placed in position through the two small holes 410. The fasteners 420 thus affix the mounting plate to the physical item.

Many physical items, however, do not have mounting surfaces applicable to the aforementioned mounting methods. In such instances, the module may be attached by drilling a hole 440 in the flange such that a wire 450 can be passed through the hole to form a loop which then wraps around the item.

Referring now to the electronics of the depicted data module, it is to be noted that such electronics are mounted on the module's circuit board for use in connection with integrated circuit 120 which acts as the module's memory device. The circuit board thus mounts several discrete components, such components being electrically connected in the arrangement shown in FIG. 3A. Memory device 120 is preferably a Microchip 24LC02. Many other memory devices, however, can be used in the module but for ease of understanding, the Microchip 24LC02 will be discussed. In the presently preferred embodiment the following component part numbers or values are assigned to the remaining components of the data module (FIG. 3A). Resistor 130 has a resistance of 47 K ohms. Zener diode 140 and zener diode 150 are selected as part number 1N5233B diodes. Capacitor 160 has a capacitance of 0.22 uF. Rectifier diode 170 and rectifier diode 180 are selected as part number 1N4001 diodes.

A common requirement of integrated circuits is the ability to withstand five discharges (ESD) at 1000 Volts, without leakage current increasing to 1 uA. However, a de facto standard of 2000 V ESD immunity has been springing up for many applications. However, even this level of ESD immunity may be insufficient for high-noise applications. Specifically, in a large-scale systems environment, data modules will face some unusual integrity requirements. Since modules may be exposed to very rough treatment, in consumer and industrial environments, they should preferably have a very high level of immunity to electrostatic discharge (ESD). The electronic data module of the presently preferred embodiment includes two ESD protection diodes, which helps to prevent against data loss under severe electrostatic discharge conditions.

In an alternative embodiment of the invention (shown at 90' in FIGS. 2B and 3B), the diodes, capacitor, resistor and memory device all are incorporated into a single integrated circuit 122. The electronic data module thus stores information in a memory device with integrated diodes, resistor and capacitor. As indicated, the highly integrated circuit highly integrated circuit 122 is housed in a casing identical to that shown in FIG. 2A. The 122 is mounted to a rigid printed circuit board 100' which differs principally from circuit board 100 in its through-hole vias which are designed to accommodate highly integrated circuit 122. Three contacts are again used to communicate with the memory device, the first and second contacts taking the form of concentric inner and outer conductive rings 190', 195' which are etched into the top surface of the printed circuit board 100. The third contact is the module's casing 110 which is electrically connected to circuit board 100'. The inner conductive ring 195' is electrically isolated from the outer conductive ring 190', and the outer conductive ring is electrically isolated from the casing 110. The inner conductive ring 195 also is electrically isolated from the casing 110.

As indicated in FIG. 4, a host system 95 selectively connects to module 90 to direct communication of the data contained therein. In the preferred embodiment the host system connects to the data module using a pair of pogo pins 500, 5 10, and a conductive sleeve 520 which is configured to fit over the casing (see FIG. 6). Clock pogo pin 500 and data pogo pin 510 are chosen as IDI part number S4B5G. The host system includes a microprocessor 570, such microprocessor being configured to read data from the module and write data to the module via a circuit which includes clock and data lines. An exemplary host system circuit is shown in FIG. 4. The depicted circuit includes a pull-down resistor 530 having a resistance of 47K ohms, a pull-up resistor 550 having a resistance of 1.5K ohms, and current drivers 540 and 560 which are P channel FETs. In the following discussion, the current drivers 540 and 560 are described as being turned on or turned off by microprocessor 570. One skilled in the art of electronic engineering will understand that the gate of a current driver would be connected to an output port pin of the microprocessor. A program running in microprocessor 570 would set or clear the output port pin of the microprocessor as desired. A clear output port pin will turn on the associated current driver. A set output port pin will turn off the associated current driver.

In FIG. 6, a host system head 490 is shown in cross section, such head being composed of clock pogo pin 500, data pogo pin 510 and conductive sleeve 520. When applied to a data module, the clock pogo pin contacts inner conductive ring 195, the data pogo pin contacts outer conductive ring 190, and the wand head contacts casing 110. These three points of electrical contact provide signal paths for a clock line, a data line and a ground line.

Referring again to FIG. 4, it will be noted that the clock line is connected to an input pin 590 on the microprocessor, and the data line is connected to a bi-directional port pin 580, also on the microprocessor. The clock line is driven by current driver 540, the microprocessor turning the current driver either on or off. If the microprocessor turns current driver 540 off, the clock line will be pulled to logic 0 level by pull down resistor 530. If the microprocessor turns current driver 540 on, the current driver 540 brings the clock line to a logic 1 level. The data line is pulled to a logic 1 level by pull-up resistor 550, and is pulled to a logic 0 level by either the bi-directional port pin 580 of the microprocessor or by the module's memory device. The current driver 560 must be off whenever the data line is to be pulled to a logic 0 level.

To communicate with the data module the host system uses a modified version of a Phillips Electronics I squared C (IIC) bus. Full documentation of the conventional I squared C bus is available from Phillips Electronics. The modified bus structure is innovative in that the clock and data lines power the electronic data module. Consequently, no power line is required with the modified (PIIC) bus. The IIC bus limits bus capacitance to 400 pF on the clock and data lines. There is no limit on the clock line capacitance with the PIIC bus. The IIC bus limits the maximum high level input current at 90% Vdd for both clock and data pins to 10 uA There is no limit on the high level input current at 90% Vdd for clock current with the PIIC bus. The bus clock is limited to 100 kHz on the IIC bus. The PIIC bus does not have a limit on the bus clock. The preferred embodiment of the electronic data module uses up to a 400 kHz bus clock.

The PIIC bus also provides a simple method where a host can power and communicate with a electronic data module using two signal lines. These signal lines are designated clock and data. The host has a very low impedance source driver with a pull down resistor on the clock line. The clock line thus can provide sufficient current, while in a high state, to power the electronic data module and also charge a capacitor on the electronic data module. When the clock line is in a low state, the electronic data module draws power from the onboard capacitor that was charged during the high state.

As will be appreciated by those skilled in the art, communication between the host system and the data module includes four basic steps: (1) the host system recognizes that a module is present; (2) the module is reset; (3) data transfers are initiated; and (4) the host recognizes that the data module is no longer present.

In operation, the microprocessor begins by turning on current driver 560. When the host system contacts a data module, current flows through rectifier diode 180, charging capacitor 160 and supplying power to the module's memory device. Current also flows through resistor 130. Resistor 130 thus acts as a pull-up resistor, bringing the clock line to a logic 1 level. The microprocessor polls the input pin 590 looking for a logic 1 level which indicates contact with a data module. Upon detecting such contact, microprocessor 570 turns on current driver 540, and turns off current driver 560, and begins execution of the reset step.

Figure 11E:
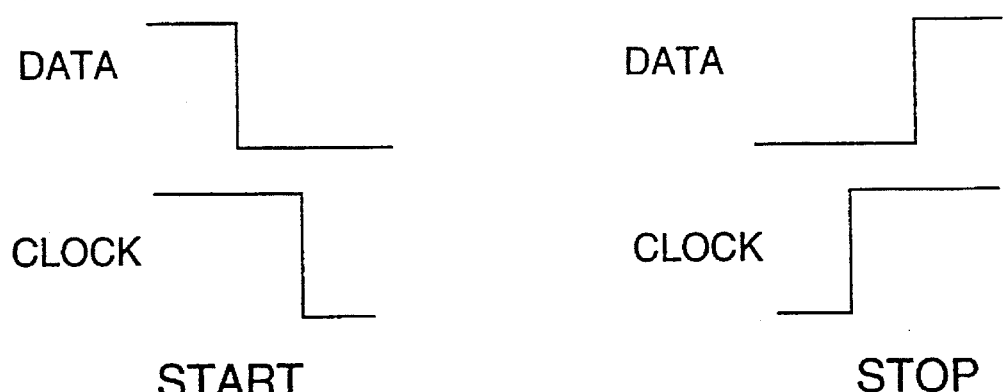
FIG. 11E is a timing diagram illustrating a stop command.

The reset step is composed of a start command (FIG. 11D) and a stop command (FIG. 11E). During the start command, the microprocessor sets the bi-directional port pin to a logic 0 level and the data line correspondingly goes to a logic 0 level. Next, the microprocessor turns off the current driver bringing the clock line to a logic 0 level. The microprocessor then executes the stop command (FIG. 11E) by turning on the current driver 540 thus resetting the clock line to a logic 1 level. The microprocessor then sets the bi-directional port pin 580 to a logic 1 level, and the data line goes to a logic 1 level. The host system then moves to the third step in communication with the module, the data transfer step.

There are two types of data transfers, write transfers and read transfers. Each type of transfer is started by a start command followed by a command word. A command word is shown illustratively in FIG. 11A. As indicated, a command word is a short block of overhead bits, such bits being sent from the host system to the module at the start of each data transfer so as to define the transfer type. FIG. 11A shows an exemplary organization of overhead bits (or address bits) which are used to initiate the write operation.

As should be apparent, the illustrated command word consists of eight bits, such bits being preceded by a start bit and followed by an acknowledged bit. The bits are transmitted from the host system to the data module in accordance with write data time slots. Moving left-to-right in FIG. 11A, it will be noted that the first bit of the command word is set to logic 1 level, the second bit is set to a logic 0 level, the third bit is set to logic 1 level, and the fourth bit is set to logic 0 level. The next three bits are defined as the device address bits, and are effective in identifying the memory device. The last bit determines whether a read or a write operation is to follow. If the last bit is set to a logic 0 level, as in FIG. 11A, a write transfer will take place. If the last bit is set to a logic 1 level, a read transfer will take place. Each of these bits, bit one to bit eight, is transmitted to the module within a separate write data time slot.

Figure 11F:
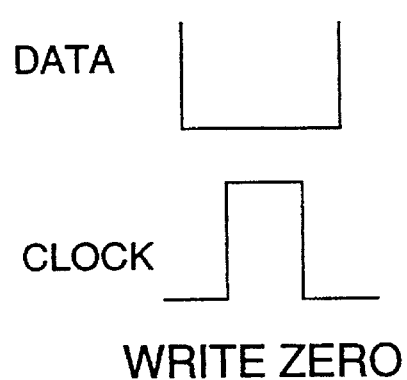
FIG. 11F is a timing diagram illustrating the clock and data lines during a write-0 operation.
Figure 11G:
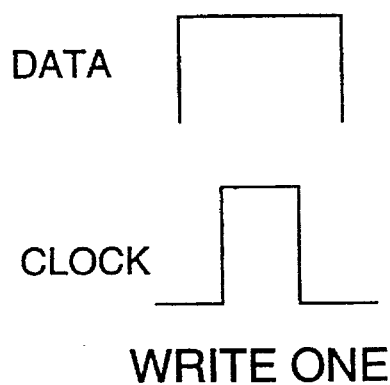
FIG. 11G is a timing diagram illustrating the clock and data lines during a write-1 operation.
Figure 11H:
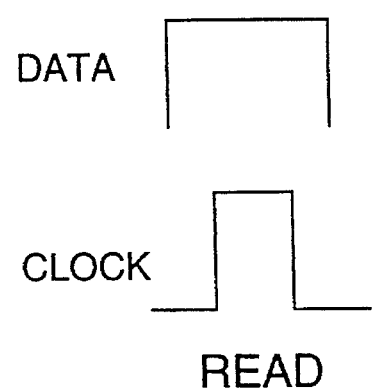
FIG. 11H is a timing diagram illustrating the clock and data lines during a read operation.

There are two types of write data operations, write-0 operations (FIG. 11F) and write-1 operations (FIG. 11G). A read operation is shown in FIG. 11H. Timing parameters are device dependent and will not be specified in this description. The presently preferred memory device 120 is Micro-Chip 24LC02B. However, many other memory sizes and speeds of serial EEPROM memories are available. After a successful data transfer, the receiving device (the memory device or the microprocessor) generates an acknowledge signal. This pulls the data line low during the ninth clock cycle, signaling that eight bits of data have been received.

The memory device generates an acknowledge, and the host system sends a byte address which identifies the memory device address that is to be written to. After receiving another acknowledge from the memory device, the host system transmits a data byte (data bits) to the addressed memory location. The memory device acknowledges once more, and the host system generates a stop command, at which time the memory device begins its internal programming cycle. While this internal cycle is in progress, the memory device will not respond to any request from the host system.

In what is referred to as a "page write mode", the memory device may write up to eight bytes of data in a single write cycle. The page write mode is initiated in the same manner as just-described, but instead of terminating after a single byte, the host system is allowed to send up to seven additional bytes. After each byte has been transmitted the memory device responds with an acknowledge signal, and internally increments the three low order address bits by one. The high order address bits remain unchanged. If the host system transmits more than eight bytes prior to sending the stop command, the address counter "wraps around", and previously transmitted data will be overwritten. Once all eight bytes are received, and the stop command has been sent by the host system, the internal programming cycle begins.

The read operation (shown illustratively in FIG. 11C) is initiated in the same manner as the write operation, with the notable exception that the read/write bit is set to one. As will now be described, various different read operations are possible, including: immediate address reading, selective reading, and sequential reading.

In the immediate access mode, the memory device's address counter contains an address equivalent to the last byte accessed, incremented by one. In other words, if the last access was to address N, the read operation immediately following would access data from address N+1. If N=255 (assuming an eight bit address), then the counter will wrap around to address zero and continue to clock out data. After the memory device receives the command word, it issues an acknowledge, and then transmits the eight data bits requested. The host does not send an acknowledge but will generate a stop command.

The selective access read operation allows the host system to select, at random, any memory location from which data may be read. The host system first performs a "dummy" write operation by sending start command, slave address (or device address), and byte address of the location which is to be read. After the memory device acknowledges the byte address, the host system resends the start command and the slave address, this time with the read/write bit set to one. The memory device then responds with its acknowledge and sends the eight data bits. The host does not send an acknowledge but will generate a stop command.

The sequential access read operation can be initiated by either the immediate access read operation or the selective access read operation. After the memory device sends the initial eight bit byte requested, the host system will respond with an acknowledge signal which tells the memory device that more data is required. The memory device will continue to output and eight bit byte for each acknowledge sent by the host system. The operation will terminate when the host system fails to respond with an acknowledge, thus sending the stop command.

Data is transmitted from the memory device sequentially with data from address N followed by data from address N+1. An address counter increments all of the memory device's address bits so that the entire memory array can be read during one operation. If more than the 256 bytes are read out, the counter will "wrap around" and continue to clock out data bytes.

These innovative ideas are used as parts of a very innovative system architecture. The electronic module enabled by the innovative teachings herein is extremely compact and extremely cheap. From a systems point of view, this module is in some ways more analogous to a read/write bar code than to a conventional electronic memory system. Thus, this innovative module can be used for price tags, for inventory tags, for work-in-progress monitoring, for retail sales (to permit customers to select merchandise (e.g. by taking one module or a handful of modules to a cashier or to an automated check-out machine), without exposing the actual inventory to pilferage), and for a wide variety of other such compact data transfer applications. Thus, the innovative module described can be regarded as an electric token, which is as portable and rugged as a conventional token, but which is far more versatile.

Since the data module is designed to be used as a removable tagging device, it can be viewed, at the system level, as a memory element plagued by numerous cold solder joints. During either reading or writing operations, physical contact with the module may be broken. This, in turn, may cause either the received data to be erroneous or the transmitted data to be incomplete.

It is therefore recommended that the following steps be followed during each read operation: (1) set the data module to a known state; (2) issue a read command word; (3) read the data into the host system; (4) repeat steps 1 through 3 five times; and (5) use majority wins logic to confirm data. For a write operation, the following steps are recommended: (1) set the module to a known state; (2) issue a write command word; (3) write data to the data module; (4) perform a read operation of such data; and (5) compare the host system's transmitted data to the data received from the data module.

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples do not nearly exhaust the full scope of the variations in the disclosed novel concepts.

For example, by including integrated circuits with more security features (such as Catalyst CAT35C704), the innovative module bus architecture can also be used for applications where security is a high priority. Advantageous applications of this type may include "smart cards", personnel identification badges, transport of confidential data and electronically verified currency.

For another example, by including integrated circuits with a write protect feature (such as a MicroChip 24LC02), the innovative module acts as a programmable read only memory. Advantageous applications of this type may include copy protection of software and personnel identification badges. A programmable chip would allow the locking of a variable range of memory.

For another example, by including integrated circuits with a larger memory device (such as a MicroChip 24C65), the innovative module acts as a small floppy disk. Advantageous applications of this type may include personnel identification badges where a photo of a person can be digitized and stored on the module. Also full manifests for large cargo containers or rail cars can be stored on a module attached to the container or rail car. Also, the module can act as a data carrier. The module doesn't have to be attached to any physical item, but can be transported by itself from one location to another carrying data.

While the present invention has been shown and described with reference to the foregoing preferred embodiment, it will be apparent to those skilled in the art that various changes in form and detail may be made without departing from the spirit and scope of the invention as defined by the claims.

I claim:

1. A compact electronic data module comprising:
   a conductive tubular casing which defines a channel extending between opposite casing ends;
   a nonvolatile memory device electrically connected to said casing to define a common ground; and
   a generally planar circuit board having a first side with a pair of electrically conductive contact surfaces, and a second side which mounts said nonvolatile memory device in a determined electrical relation with said contact surfaces;
   said circuit board being installed within said casing such that said contact surfaces are substantially exposed for periodic electrical access of said nonvolatile memory device.

2. The data module of claim 1, wherein said contact surfaces are concentrically arranged.

3. The data module of claim 1, wherein said nonvolatile memory device is selectively powered via said contact surfaces.

4. The data module of claim 1, wherein said contact surfaces connect to clock and data pins of said nonvolatile memory device.

5. The data module of claim 4, wherein said nonvolatile memory device is selectively powered via clock and data input lines.

6. The data module of claim 1, wherein said casing defines an annular flange adjacent one of said opposite casing ends.

7. The data module of claim 3, wherein said circuit board is mounted adjacent a non-flanged end of said casing.

8. The data module of claim 1, wherein said second side of said circuit board is set in a potting material.

9. A compact electronic data module comprising:
   a unitary conductive casing which defines a channel extending between opposite casing ends;
   a generally planar circuit board having first and second sides, said first side defining a pair of electrically conductive contact surfaces, said circuit board being installed within said casing adjacent one of said opposite casing ends such that said contact surfaces are substantially exposed; and
   a nonvolatile memory device mounted on said second side of said circuit board, said nonvolatile memory device including a clock pin electrically connected to a first one of said contact surfaces for selected connection to a clock signal line, a data pin electrically connected to a second one of said contact surfaces for selected connection to a data signal line, and a ground pin electrically connected to said casing for selected connection to a common ground, said nonvolatile memory device being powered via said signal lines during periodic electrical access of said nonvolatile memory device.

10. The data module of claim 9, wherein said contact surfaces are concentrically arranged.

11. The data module of claim 9, wherein said casing defines an annular flange adjacent one of said opposite casing ends.

12. The data module of claim 11, wherein said circuit board is mounted adjacent a non-flanged end of said casing.

13. The data module of claim 9, wherein said second side of said circuit board is set in a potting material.

* * * * *